United States Patent [19]
Julstrom et al.

[11] Patent Number: 4,811,019
[45] Date of Patent: Mar. 7, 1989

[54] DELTA MODULATION ENCODING/DECODING CIRCUITRY

[75] Inventors: Stephen D. Julstrom, Chicago; Mark W. Gilbert, Des Plaines, both of Ill.

[73] Assignee: Shure Brothers Incorporated, Inc., Evanston, Ill.

[21] Appl. No.: 869,193

[22] Filed: May 30, 1986

[51] Int. Cl.⁴ .................................... H03M 00/00
[52] U.S. Cl. .................................... 341/143; 341/144; 341/150; 341/155; 332/11 D
[58] Field of Search ............... 340/347 AD, 347 DA, 340/347 M; 332/11 D; 375/28-32; 341/155, 156, 166, 169, 172, 126-128, 143, 144, 150, 152, 154

[56] References Cited

U.S. PATENT DOCUMENTS

| | | | |
|---|---|---|---|
| 3,109,989 | 11/1963 | Linder | 332/11 D |
| 3,490,045 | 1/1970 | DeBoer et al. | 332/11 D |
| 3,582,784 | 6/1971 | Gaunt | 332/11 D |
| 3,654,560 | 4/1972 | Cath et al. | 328/162 X |
| 3,681,531 | 8/1972 | Burkhard et al. | 340/172.5 |
| 3,681,756 | 8/1972 | Burkhard et al. | 340/172.5 |
| 3,855,555 | 12/1974 | Burkhard et al. | 332/11 D |
| 3,857,111 | 12/1974 | Deschenes et al. | 332/11 D |
| 4,042,921 | 8/1977 | Smith | 340/347 AD |
| 4,071,825 | 1/1978 | McGuffin | 325/38 |
| 4,190,801 | 2/1980 | DeFreitas | 325/38 |
| 4,254,502 | 3/1981 | DeFreitas et al. | 375/30 |
| 4,313,204 | 1/1982 | DeFreitas | 375/28 |

OTHER PUBLICATIONS

The Engineering Staff of Analog Devices, Inc., Analog-Digital Conversion Handbook, 6/1972, pp. II-162 to II-167, II-32 to II-35; & II-48 to II-51.

Ryder, "Electronic Fundamentals and Applications," Prentice-Hall, Inc., 1950, pp. 566-569.
Glasbergen, This Versatile IC Digitizes Speech, Philips Telecommunication Review, vol. 39, No. 3, 9/1981, pp. 147-154.
J. E. Abate, "Linear and Adaptive Delta Modulation", *Proceedings of the IEEE*, vol. 55, No. 3, Mar. 1967.
B. Blesser, "Digitization of Audio", *Journal of the Audio Engineering Society*, vol. 26, No. 10, Oct. 1978.
K. J. Gundry et al., "Recent Developments in Digital Audio Techniques", Audio Engineering Society Prepring No. 1956, 73rd Convention, Mar. 1983.
C. Todd et al., "A Digital Audio System for Broadcast and Prerecorded Media", Audio Engineering Society Preprint No. 2071, 75th Convention, Mar. 1984.
R. W. Adams, "Companded Predictive Delta Modulation: A Low Cost Conversion Technique for Digital Recording", Journal of the Audio Engineering Society, vol. 32, No. 9, Sep. 1984.
MC3417 Series Data Sheet, "Continuously Variable Slope Delta Modulator/Demodulator", Motorola Semiconductor, 1978.

*Primary Examiner*—William M. Shoop, Jr.
*Assistant Examiner*—Brian Young
*Attorney, Agent, or Firm*—Allegretti & Witcoff, Ltd.

[57] ABSTRACT

An adaptive delta modulation circuit having an analog adaptation circuit and an integrator circuit. The adaptation circuit exponentially converts a voltage which is proportional to the average of a time duration of an overload control signal to an adaptation current which is averaged and converted to an adaptation voltage. An integrator circuit includes a sole switch which shorts to ground a circuit point for generating an analog signal formed of line segments; each segment has a slope magnitude controllable by the adaptation voltage.

11 Claims, 3 Drawing Sheets

DELTA MODULATION ENCODING/DECODING CIRCUITRY

BACKGROUND OF THE INVENTION

The present invention relates to digitally encoding and decoding analog signals which, for example, carry audio information, and more particularly relates to delta modulation coders.

In a delta modulation method of digital coding, analog signals are represented by a one-bit wide binary bit stream (of logical 1's and 0's). The encoded digital signal represents the slopes of individual line segments which together approximate the analog signal. The digital signal is generated by determining, for each segment, the difference between the analog signal and a reference signal which is a reconstructed approximation of the original analog signal. The digital signal represents, at sequential points in time, whether the analog signal is greater or less than a proportion of the reference, and the slope of the reference is made positive or negative accordingly to more closely approximate the analog signal.

The encoded digital signal can be stored for short or long periods of delay for later playback or may be transmitted or broadcast in its digital form, all with little or no signal degradation. In some specific applications, a well-designed delta modulation circuit can give superior results as compared to pulse code modulation circuits (where the amplitude of each sample is represented by typically 8 to 16 bits) of the same total bit rate. Additionally, the delta modulation circuitry is generally much simpler and, therefore, less expensive.

A delta modulation decoder (for converting digital to analog) consists primarily of an integrator which produces an output signal having a plurality of line segments. The line segment outputs have a positive slope for one input logic state and a negative slope for the other input logic state. With appropriate encoded digital data, an approximation to the original analog input signal will be produced by the line segment outputs.

A delta modulation encoder (for converting analog to digital) contains a similar integrator which includes feedback from the encoded digital output. The output of the encoder integrator (the reference signal) is compared to the analog input signal to determine the next proper digital output logic state which will cause the reference signal to approach the input analog signal.

Basic delta modulation circuits are limited in their dynamic range; that is, the ability to accurately encode and decode high and low level signals. High level, high frequency signals are distorted by "slope overload," a condition in which the rat of change of the output of the integrator is insufficient to follow the analog signal. The accuracy of low level signals is limited by noise, distorting and "squeals" (beat tones) produced by the jagged approximation of the analog signal.

Heretofore, the dynamic range of delta modulation circuits has been widened at both ends by increasing the bit rate, but for practical and economic reasons, this rate should be minimized. Additionally, positive/negative slope assymetry has been employed in the integrator to move the squeals in the "idle state" (no analog input signal) predominantly above the relevant signal passband. Also, dither noise has been added to the encoder input or comparator input to transform squeal at idle and distortion at low signal levels into random noise (hiss). Also complementary high frequency pre-emphasis and de-emphasis can be used in the encoder and decoder, respectively, to reduce high frequency noise but with a corresponding lower high frequency overload point.

Beyond this, the dynamic range (but not the maximum signal-to-noise ratio) can be improved substantially by adapting the magnitude of the integrator slope (or "step" size) to the maximum magnitude of the slope of the analog input signal This is often accomplished by increasing the integrator slope upwards relative to a low value at idle in response to an excessive number of consecutive 1's or 0's in the bit stream (indicating the onset of slope overload).

Several desirable characteristics of high quality adaptive delta modulation circuitry of this type have, heretofore, been difficult to obtain, particularly in a simple and inexpensive manner.

It is therefore an object of the present invention to provide a simple and inexpensive adaptive delta modulation circuitry.

It is another object of the present invention to provide slope adapting circuitry which responds similarly to similar relative changes in signal slope throughout a wide adaptation range.

It is yet another object to provide slope adapting circuitry which responds quickly to a rapid increase in signal slope without significant "overshoot" (excessive increase in integrator slope).

It is another object to provide slope adapting circuitry which provides a simple interface between the digital slope overload sensing circuitry, which will typically be powered from a single-polarity low voltage (+5 volt) power supply, and the analog adaptation and signal handling circuitry, which will typically be powered from a bipolar, higher voltage (±15 volts) power supply, while still allowing for isolation of digital circuitry noise from the analog circuitry.

It is another object to provide integrator circuitry which interfaces between the digital circuitry and the analog circuitry, typically powered from the just mentioned differing supplies, and which isolates digital circuitry noise from the analog circuitry.

It is another object to provide integrator circuitry which has its positive and negative slopes controlled without significant symmetry matching errors between encoder and decoder due to parts tolerances and switch timing errors.

SUMMARY OF THE INVENTION

These and other objects of the invention are achieved in a novel adaptive delta modulation circuitry.

In a preferred embodiment, a digital slope overload-sensing portion of the circuitry develops a logic signal having a logic 1 (+5 volts) at its output whenever the last four bits of the digital bit stream have been all 1's or all 0's, indicating the onset of slope overload. Otherwise, the overload-sensing portion generates a logic signal having a logic 0 (0 volts).

This logic signal is low pass filtered (averaged) and scaled in amplitude by a simple resistor-capacitor network which controls the basic attack time (slope increase adaptation time), filters out high speed digital logic transitions to prevent undesirable interactions in the analog circuitry, and references the network's output primarily to the analog adaptation circuitry ground rather than the digital circuitry ground. This last characteristic is needed since, in practical circuit layouts, ground trace resistance and inductance will cause different ground points to have different D.C. and A.C. potentials. This is particularly true of the digital circuitry particularly any memory circuitry) relative to the analog circuitry, due to the relatively high current, high speed logic level transitions.

The output of this filter network is applied to the base of an NPN bipolar transistor acting as an exponential voltage-to-current converter. The collector of the transistor is connected to an inverting operational amplifier stage having a parallel resistor-capacitor feedback network acting as a low-pass filtered current-to-voltage converter to produce the integrator slope-determining adaptation voltage. The parallel RC feedback network determines a decay time constant of the adaptation voltage of 22 msec, occurring following the cessation of the sensing of slope overload. The feedback capacitor is charged to produce a higher adaptation voltage by the current output of the transistor. The voltage on the base of the transistor rises fairly rapidly and approximately linearly (on the early part of an exponential charging curve) in response to the sensing of the onset of slope overload. The current output of the transistor follows the exponential of the rising base voltage, giving a tenfold increase in current for a slope overload sensing duration of about 0.26 msec, a hundredfold increase in about 0.52 msec, etc. Transistor currents from less than 0.1 μA to over 1 mA can be reached with relatively small differences in the required duration of slope overload, leading to similar adaptation behavior at lower required adaptation voltages, where required transistor currents are lower, as at higher required adaptation voltages, where required transistor currents are higher.

Upon the cessation of the sensing of slope overload, the voltage at the base of the transistor decays exponentially, giving a tenfold decrease in transistor current in less than 1 msec from higher currents, and a somewhat longer time from lower currents. As a result, the adaptation voltage stops its rise and begins its decay quickly following the cessation of the sensing of slope overload. This minimizes overshoot of the adaptation voltage and resultant unnecessary rise in noise floor of the final analog output signal, particularly for higher signal levels where this would be most bothersome. The decay rate relative to the feedback network time constant of 22 msec is substantially independent of the time from the last sensing of slope overload.

The current interface between the transistor and the op amp allows decoupling of the grounds of these two sections, if needed, to further isolate the adaptation voltage ground reference from the digital circuitry. This ground reference is part of the analog signal circuitry grounding, which must be totally free of digital circuitry noise.

The adaptation voltage at idle can be as low as 50 to 100 mV, just above the region where circuit offset voltages would significantly degrade performance. The voltage can adapt up to the clipping point of the op amp at about 13 volts, giving an adaptation range and resultant dynamic range increase of over 40 dB.

This single polarity adaptation voltage is used to control the magnitude of both the positive and negative slopes of the integrator. Previous methods of obtaining variable positive and negative slopes having included inverting the adaptation voltage and switching the inverted and noninverted versions alternately into a conventional integrator with two analog switches controlled by the bit stream and its complement, or using a balanced-input integrator and four analog switches to alternately interchange the inverting and noninverting integrator inputs between the adaptation voltage and ground. These methods can have difficulty maintaining similar symmetry of decoder positive and negative integrator slopes relative to encoder integrator slopes due to relative amplitude and timing imbalances, leading to distortion and transient errors related to the adaptation process. Interfacing between the commonly used digital and analog supply voltages described above is also complicated by these methods.

The integrator of the preferred embodiment instead uses a single 5 volt-powered analog switch controlled by the digital bit stream which shorts a scaled version of the adaptation voltage to ground when activated. This chopped version feeds the noninverting input of a balanced-input integrator, which allows filtering of its fast logic transitions before entering any active analog circuitry which might not properly handle such rapid transitions. The inverting input of the balanced integrator receives a scaled version of the adaptation voltage appropriate to approximately balance out the average feedthrough of the adaptation voltage into the noninverting integrator input, and thus allowing the chopped version feeding this input to produce both positive and negative slopes. Some specific imbalance is desired to maintain a specific positive, negative slope assymetry for the reason mentioned heretofore. However, the symmetry (or assymetry) of the decoder should closely track the specific symmetry (or assymetry) of the encoder. This can be ensured either through close parts tolerances, or a single trim resistor on the decoder to trim the inverting integrator input scaling, for example. The relative encoder-decoder timing errors associated with the single analog switch are generally negligible. Isolation of digital circuitry noise and grounds from the analog circuitry and interfacing between the differing supply voltages are both aided by this circuit approach, as will be more evident in the description of the circuitry.

DETAILED DESCRIPTION OF THE PREFERRED EMBODIMENT

Figure 1:
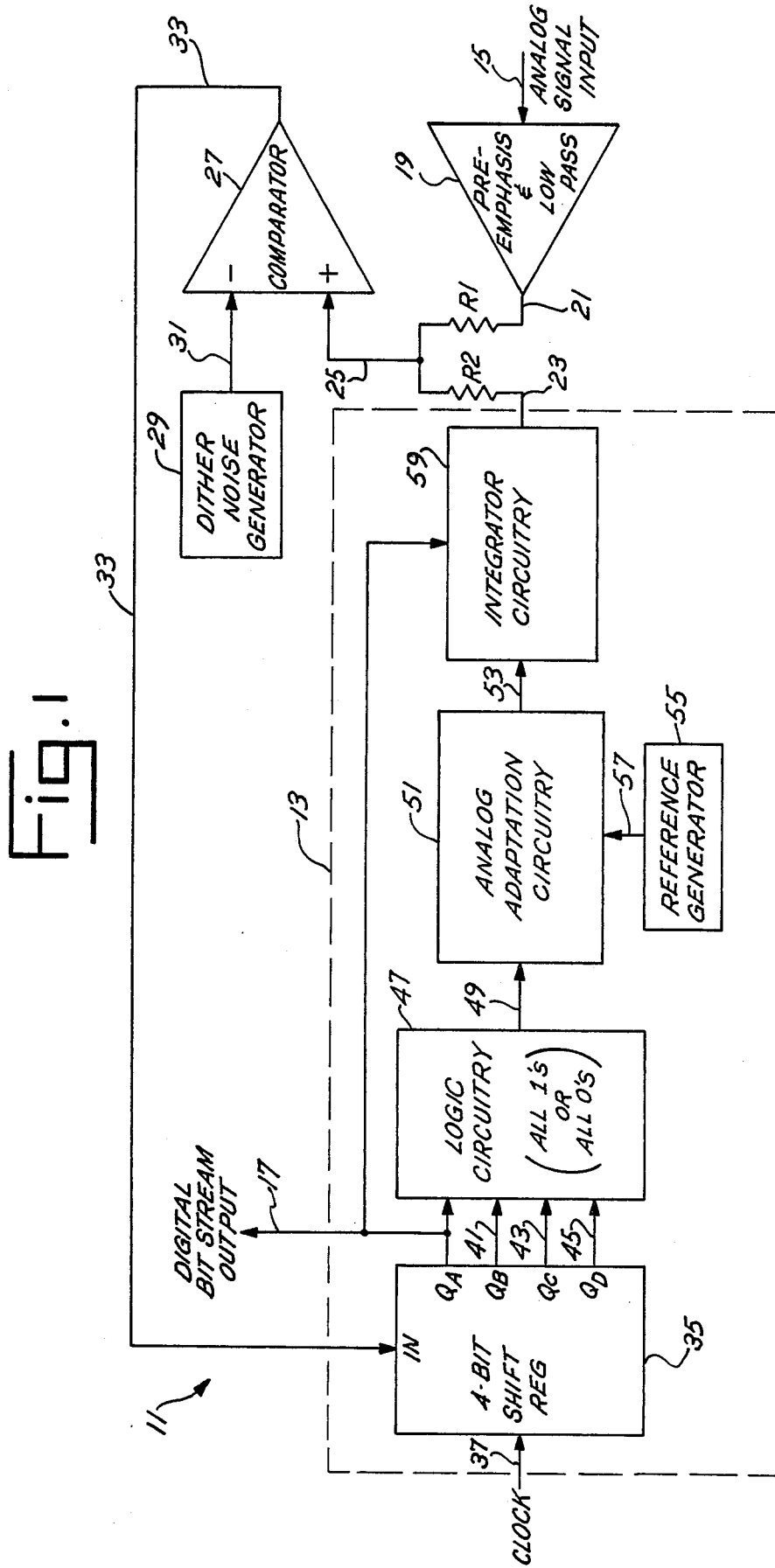
FIG. 1 is a block diagram of a preferred embodiment of the adaptive coding circuitry of the present invention used in an analog-to-digital encoder.

Referring to FIG. 1, a delta modulation analog-to-digital encoder 11 includes an adaptive coding circuitry 13. An analog signal is input to the encoder along a conductor 15 for encoding the analog signal into a digital signal which appears along an output conductor 17.

The input analog signal initially undergoes low-pass filtering in a circuitry 19 to attenuate very high frequency components of the analog signal which would stress the delta modulation system. Circuitry 19 also applies pre-emphasis to somewhat lower high frequencies, in a conventional fashion.

The output of circuitry 19 appears on a conductor 21 and is mixed with the output of adaptive coding circuitry 13 which appears on a conductor 23. The signals on conductors 21, 23 pass through resistors R1 and R2, respectively, and are mixed. The mixed voltage appears at the junction of resistors R1 and R2 on a conductor 25.

The signal appearing on conductor 23 is formed of a plurality of individual line segments which together approximate a scaled inversion of the analog input signal on conductor 21.

A comparator 27 compares the mixed voltage appearing on conductor 25 with a very small random noise voltage of approximately 0 volts (average dc value) appearing at the output of a dither noise generator 29 on conductor 31. The signal on conductor 25 is applied to the noninverting input of comparator 27 and the signal on conductor 31 is applied to the inverting input of comparator 27.

The output of comparator 27 appears on a conductor 33 and alternates between the logic levels of 0 and 5 volts. The logic signal appearing on conductor 33 is used to generate the digital bit stream appearing on conductor 17 which is used by coding circuitry 13 in order to force the differential input voltage on conductor 25 towards the small noise voltage of approximately 0 volts. In so doing, the voltage appearing on conductor 23 becomes almost an exact, opposite polarity, scaled replica of the voltage appearing on conductor 21, as is understood. The information to create this replica is contained in the digital bit stream on conductor 17, thus constituting digital encoding of the analog input signal modified by the characteristics of circuitry 19.

The logic signal on conductor 33 is applied to a 4-bit shift register 35, as is a system clock (typically 256 kHz) via conductor 37. The first stage in shift register 35 synchronizes the logic transitions at its output $Q_A$, which appears on output conductor 17 with the system clock signal which appears on conductor 37. The four-bit shift register is powered from a 5 volt power supply. The digital bit stream on conductor 17 may feed a short term memory or long term storage medium, or a transmission or broadcast system.

At a clock transition of the clock signal on conductor 37, shift register 35 transfers the signal on conductor 33 to the output $Q_A$ which appears on conductor 17. The shift register also includes outputs $Q_B$, $Q_C$ and $Q_D$ of the last three shift register stages which appear on conductors 41, 43 and 45, respectively. At clock transition, shift register 35 shifts the output at $Q_C$ to $Q_D$, the output at $Q_B$ to $Q_C$ and the output of $Q_A$ to $Q_B$.

The outputs $Q_A$, $Q_B$, $Q_C$ and $Q_D$ represent the present and previous three digital bit stream values. The outputs are applied to a digital logic circuitry 47 which is also powered from a 5 volt power supply. Circuitry 47 produces a logic 1 (HIGH) of +5 volts onto a conductor 49 if and only if all four outputs $Q_A$, $Q_B$, $Q_C$, $Q_D$ are identical; that is, all 1's or all 0's. Such an output is used to indicate the onset of slope overload. The voltage on conductor 49 remains at logic 1 (HIGH) so long as the following $Q_A$ outputs, which are clocked into the first register of shift register 35, are identical to the outputs $Q_B$, $Q_C$, $Q_D$. As soon as the shift register outputs disagree logically, the voltage on conductor 49 is driven to a logic 0 (LOW) of 0 volts.

Thus, the logic signal on conductor 49 is used as a overload control signal for indicating the onset of slope overload. The time duration of a logic HIGH signal on conductor 49 indicates the extent of slope overload.

The logic signal on conductor 49 is applied to an analog adaptation circuitry 51 to generate an adaptation voltage appearing on a conductor 53. The adaptation voltage serves to control the magnitude of the slopes of the line segments appearing at the output of integrator circuitry 59 on conductor 23. The adaptation voltage is increased at the onset of slope overload and is decayed back down after the cessation of slope overload, as discussed previously.

A reference generator 55 establishes a temperature compensated reference voltage onto a conductor 57 for use by the adaptation circuitry as described hereinafter in connection with FIG. 3.

The adaptation voltage on conductor 53 is applied to an integrator circuitry 59 to directly vary the magnitude of the output slopes of the line segments appearing on conductor 23. Integrator circuitry 59 also receives the serial bit stream of output conductor 17 for controlling the polarity of the output slopes appearing on conductor 23.

Figure 2:
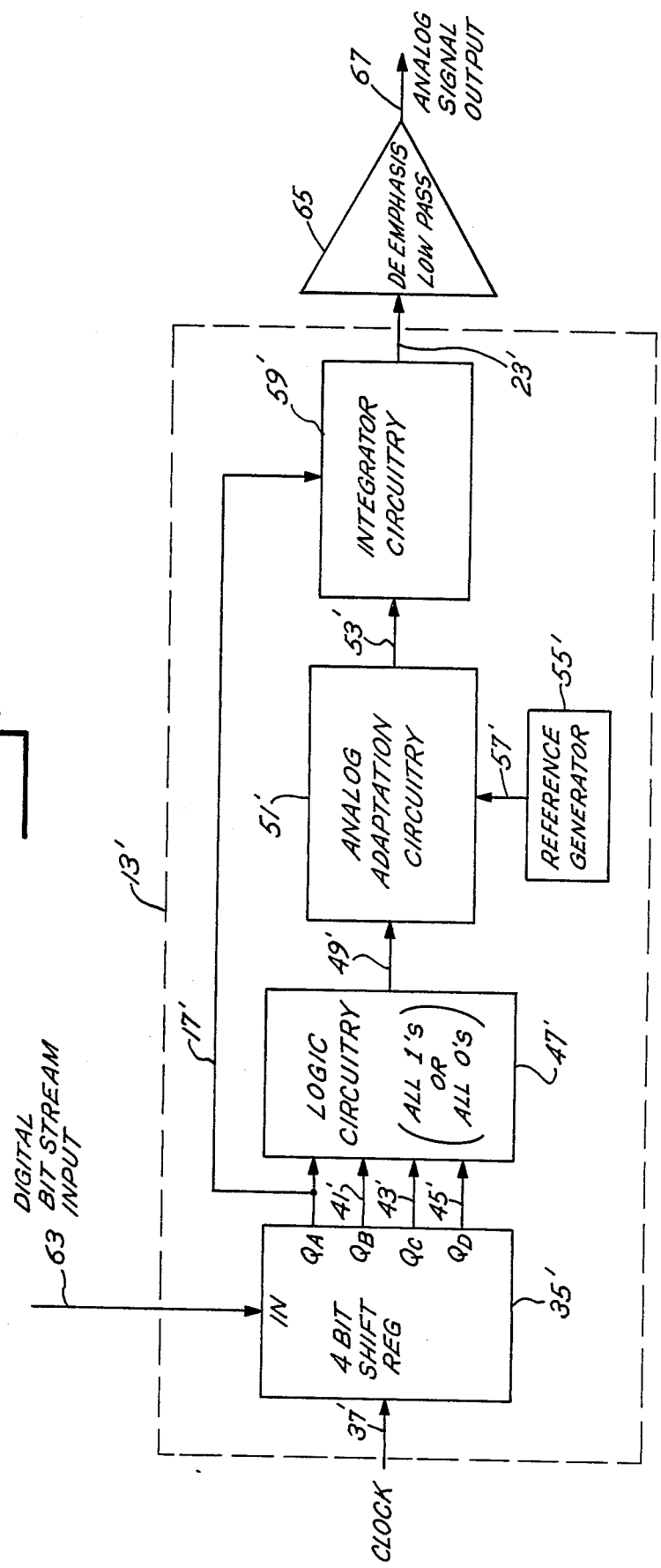
FIG. 2 is a block diagram of the adaptive coding circuitry of FIG. 1 used in a digital-to-analog decoder.

Referring to FIG. 2, a delta modulation digital-to-analog decoder 61 also includes an adaptive coding circuitry 13'. The coding circuitry 13' includes a four-bit shift register 35', a digital logic circuitry 47', an analog adaptation circuitry 51', a reference generator 55' and an integrator circuitry 59' which correspond exactly in function and structure as their corresponding components 35, 47, 51, 55 and 59, respectively, of FIG. 1. In a self-contained encodedecode system such as a short term delay, conductors 37', 57' and reference generator 55' may, in fact, be the same component as conductors 37, 57 and reference generator 55, respectively.

The digital bit stream appearing on conductor 63 may come from a short term digital memory, be recovered from a long term storage medium, or be received from a transmission or broadcast system. The bit stream is synchronized with the clock appearing on conductor 37' via shift register 35', and the bit stream reappears at output $Q_A$ of the shift register, delayed up to one clock cycle. The digital bit stream appearing on conductor 17' should be exactly the same bit stream as appears on conductor 1 of FIG. 1, only delayed in time. The voltage appearing on conductor 23' should, therefore, be an exact reconstruction of the voltage on conductor 23 of FIG. 1, subject to circuitry parts tolerances, only delayed in time.

Circuitry 65 applies de-emphasis complementary to the pre-emphasis of circuitry 19 of FIG. 1, to the signal on conductor 23' to give a substantially flat frequency response within a desired passband to the analog signal output appearing on conductor 67. Circuitry 65 also includes a low pass filter to attenuate very high frequency noise above the desired passband.

Figure 3:
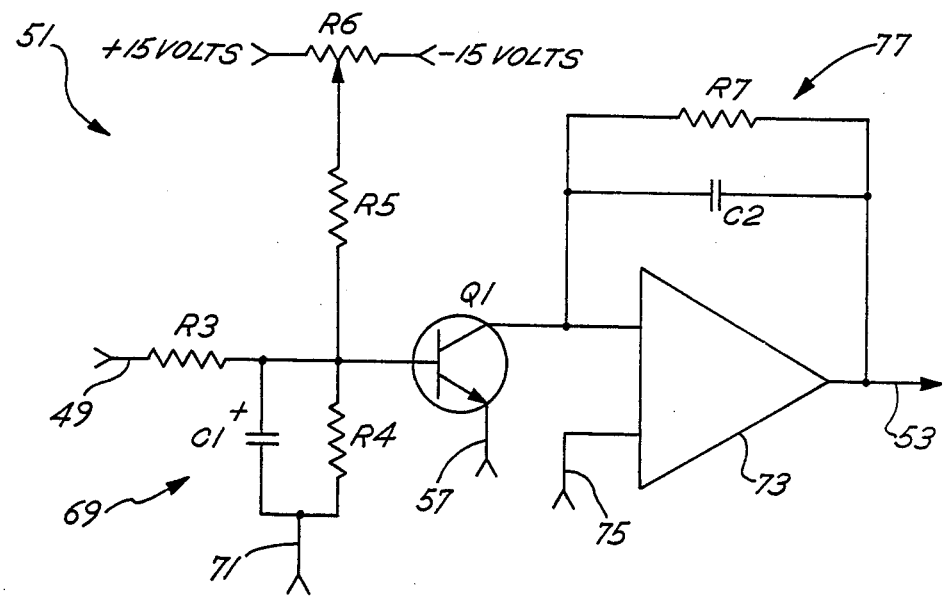
FIG. 3 is a schematic diagram of an analog adaptation circuitry of the coding circuitry of FIGS. 1 and 2.
Figure 4:
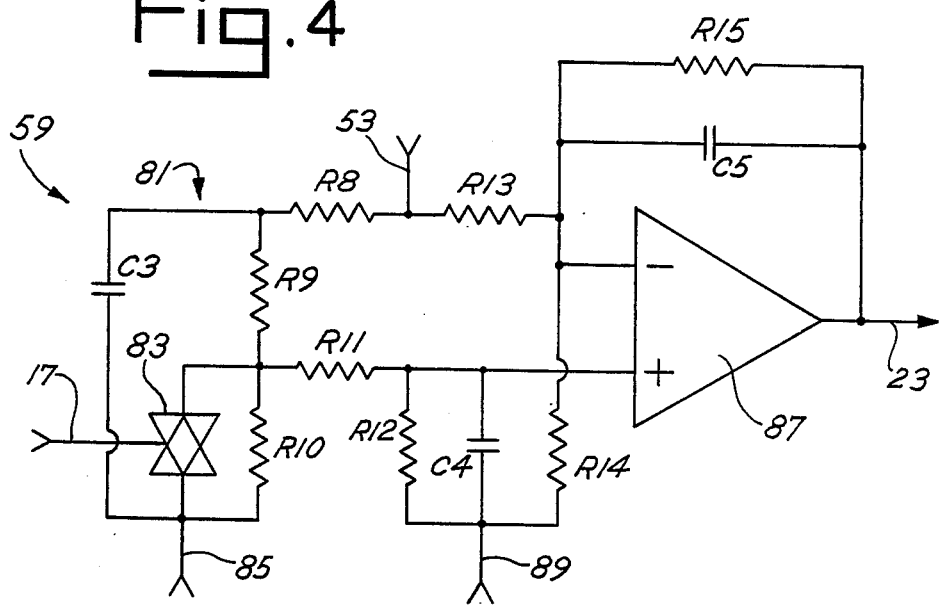
FIG. 4 is a schematic diagram of an integrator circuitry of the coding circuitry of FIGS. 1 and 2.

Analog adaptation circuitry 51 (and 51') and integrator circuitry 59 (and 59') are shown in detail in FIGS. 3 and 4, respectively. Both circuits of FIGS. 3 and 4 include op amps which are connected to a well-regulated and filtered bipolar power supply of ±15 volts.

Referring to FIG. 3, the analog adaptation circuitry 51 (and 51') receives the overload control signal appearing on conductor 49. The overload control signal is applied to a resistor-capacitor filtering network 69 comprising resistors R3, R4 and capacitor C1. Network 69 filters the fast digital logic transitions of the overload control signal, controls the voltage rise and fall times on the base of an exponential voltage-to-current converter transister Q1, and produces a voltage at transistor Q1's base proportional to the average duration of the slope overload indication, primarily referenced to a local ground on a conductor 71. The local ground on conductor 71 is separated by circuit board layout from the digital circuitry ground of shift register 35 and logic circuitry 47 to allow its isolation from the digital circuitry noise. The grounds are connected together at a remotely located, controlled common ground point.) Trimpot R6, connected between ±15 volt power supplies adjusts the voltage at the base of transistor Q1 through resister R5 to compensate for variations in the transconductance of the individual transistor used for transistor Q1 and to compensate for overall gain variations due to resistor and capacitor tolerances in all analog portions of the circuitry of FIG. 1 (and FIG. 2.)

Transistor Q1 is a general purpose silicon NPN type such as a 2N5210. The temperature compensated reference voltage of conductor 57 is applied to the emitter of transistor Q1 to place the emitter at a voltage level to provide approximately a base-emitter junction voltage drop which is negative with respect to the ground of conductor 71, such that with the base of transistor Q1 at 0 volts with respect to conductor 71, a desired transistor current in the idle state 50–100 nA results for a typical transistor used for transistor Q1. Further trimming to establish the desired idle state current is done with resistor R6 to slightly vary the voltage at the base of Q1. The reference voltage on conductor 57 can be developed using another similarly biased transistor by conventional methods.

The collector of transistor Q1 is connected to the inverting input of an operational amplifier 73, whose noninverting input is referenced to the analog signal circuitry ground on conductor 75. The ground on conductor 75 is very "clean" and is a different ground than the digital circuitry ground and than the ground on conductor 71, in the same sense as previously described.

A feedback network 77 formed of resistor R7 and capacitor C2, is connected between the output and noninverting input of op amp 73. The op amp and feedback network make a low-pass filtered current-to-voltage converter to produce the adaptation voltage onto conductor 53 referenced to the analog signal circuitry ground on conductor 75.

The values of resistor R7 and capacitor C2 determine an adaptation voltage decay time of 22 msec and an idle state voltage of 50 to 100 mV on conductor 53. Op amp 73 is a FET input type, TL074 or equivalent.

Referring to FIG. 4, integrator circuitry 59 receives the adaptation voltage on conductor 53. The adaptation voltage is applied to a network 81 consisting of resistors R8, R9, R10, a capacitor C3, and an analog switch 83. Analog switch 83 is preferably a high-speed CMOS type HC4066 powered from +5 volts. Switch 83 shorts the junction of R9 and R10 to local ground 85 when a logic HIGH (+5 volts) appears on conductor 17. Local ground 85 is also isolated from the main digital circuitry ground to avoid coupling digital circuitry noise. Resistors R8, R9, R10 scale the portion of the adaptation voltage on conductor 53 appearing at the junction of resistors R9 and R10 when switch 83 is OFF (open) to no higher than the 5 volt capability of the switch. Capacitor C3 and resistors R8 and R9 filter and isolate the rapid switch transitions of switch 83 from the analog adaptation circuitry driving conductor 53. The time constant of the filter formed is short enough to have a negligible effect on the desired variations of the scaled version of the adaption voltage at the junction of R9 and R10.

The voltage at this junction is applied through resistor R11 to the noninverting input of an operational amplifier 87, a general purpose bipolar input op amp such as RC4156. The rapid voltage transitions at the junction of resistors R9 and R10 are filtered to analog signal ground 89 by a capacitor C4 before entering op amp 87.

Resistors R13 and R14 provide a scaled version of the adaptation voltage appearing on conductor 53 to the inverting input of op amp 87. Resistors R11, R12, capacitor C4, a feedback resistor R15, a feedback capacitor C5, and op amp 87, make up a balanced, differential input integrator, providing positive and negative output slopes on conductor 23 proportional in magnitude to the adaptation voltage appearing on conductor 53. The specific degree of balance (or imbalance) between positive and negative slopes may be adjusted by trimming resistor R13, for example. A trim of ±10% from a design center value is adequate to achieve a desired setting with typical parts tolerances. In a self-contained encode-decode system, R13 in either the encoder or decoder may be left untrimmed and the other trimmed to match. Encoder and decoder positive and negative slope symmetries (or specific assymmetries) will match over the entire adaptation range to avoid distortion and transient errors.

Resistor R15 creates a "leaky" integrator to limit AC gain in the decoder integrator 59' to avoid large DC output due to offset voltage differences between op amp 87 in the encoder integrator 59 and decoder integrator 59'. Resistor R12 balances resistor R15. Encoder integrator 59 also includes resistors R12 and R15 to match the signal handling characteristics of the decoder integrator 59.

The following circuit values are given:

| Resistors | Resistance (in Ohms) |
|---|---|
| R1 | 2.4K |
| R2,R9 | 3.9K |
| R3 | 10K |
| R4 | 1.0K |
| R5 | 330K |
| R7 | 1.0 M |
| R8 | 220 |
| R10 | 2.0K |
| R11 | 5.1K |
| R12, R15 | 270K |
| R13 | 33K |
| R14 | 6.2K |
| R6 | 100K trimpot |
| Capacitors | Capacitance (in uFarads) |
| C1 | 2.2 |
| C2 | .022 |
| C3 | .047 |
| C4, C5 | .0033 |

It is to be understood, of course, that the foregoing describes different embodiments of the present invention and that modifications may be made therein without departing from the spirit or scope of the present invention as set forth in the appended claims.

What is claimed is:

1. Adaptive coding circuitry according to claim 1 wherein said logic means generates a logic control signal as said overload control signal, said logic control signal having two binary states, one of said states having a time duration indicative of the extent of slope overload; and wherein said analog adaptation means includes: circuit means for generating a first voltage proportional to the average of said time duration of said logic control signal; first conversion means for exponentially converting said first voltage to an adaptation current; and second conversion means for averaging and converting said adaption current to said adaptation voltage.

2. In an adaptive delta modulation circuit for generating an analog signal in response to a serial stream of binary logic bits, adaptive coding circuitry comprising:

logic means for monitoring a serial stream of binary logic bits and for generating an overload control signal indicative of the onset of slope overload, said logic means generating a logic control signal as said overload control signal, said logic control signal having two binary states, one of said states having a time duration indicative of the extent of slope overload;

analog adaptation means responsive to said overload control signal for generating a slope magnitude control signal indicative of a magnitude of slope, said analog adaptive means of generating an adaptation voltage as said slope magnitude control signal which is proportional to the average of the exponential of the average duration of the overload control signal, said analog adaptation means including:

circuit means for generating a first voltage proportional to the average of said time duration of said logic control signal;

first conversion means for exponentially converting said voltage to an adaptation current; and second conversion means for averaging and converting said adaption current to said adaptation voltage; and integrator means for generating an analog signal formed of line segments each having a slope magnitude characteristic controllable by said slope magnitude control signal and each having a polarity characteristic determined by the logic state of a bit of said serial stream of binary logic bits.

3. Adaptive coding circuitry according to claim 1 wherein said circuit means includes voltage averaging means for generating said first voltage; and wherein said first conversion means includes exponential voltage-to-current generator means for generating a first current exponentially related to said first voltage; and wherein said second conversion means includes operational amplifier means for averaging and converting said first current to said adaptation voltage.

4. Adaptive coding circuitry according to claim 3 wherein said logic means is referenced to a first local ground; and wherein said exponential voltage-to-current generator includes transistor means being referenced to a second local ground isolatable from said first ground.

5. Adaptive coding circuitry according to claim 3 wherein said operational amplifier means includes capacitive means for controlling the attack and decay rate of said adaptation voltage.

6. Adaptive coding circuitry according to claim 1 wherein said second conversion means provides a decay rate being substantially independent of the time duration since the last indication of the onset of slope overload.

7. Adaptive coding circuitry according to claim 6 wherein said logic means generates a logic control signal as said control signal, said logic control signal having a logic HIGH and a logic LOW state; and wherein said decay rate is substantially independent of said logic control signal when said logic control is in its logic LOW state.

8. In an adaptive delta modulation circuit for generating an analog signal in response to a serial stream of binary logic bits, adaptive coding circuitry comprising:

logic means for monitoring a serial stream of binary logic bits and for generating a control signal indicative of the onset of slope overload;

analog adaptation means responsive to said overload control signal for generating a slope magnitude control signal indicative of a magnitude of slope; and integrator means for generating an analog signal formed of line segments each having a slope magnitude characteristic controllable by said slope magnitude control signal and each having a polarity characteristic determined by the logic state of a bit of said serial stream of binary logic bits, said integrator means including a sole switch controllable by said serial stream of binary logic bits for shorting to ground a circuit point and responsively changing the polarity characteristic of said analog signal.

9. Adaptive coding circuitry according to claim 8 wherein said sole switch is operable for switching signal levels at said circuit point within a range of ground to a single-polarity power supply voltage; and wherein said analog signal is referenced to ground and varies both positively and negatively with respect to ground.

10. Adaptive coding circuitry according to claim 9 wherein the relative magnitude between the positive polarity output slope and the negative polarity output slope is adjustable by a single circuitry component value.

11. Adaptive coding circuitry according to claim 8 wherein said integrator means includes an operational amplifier for generating said analog signal, the inverting input of said operational amplifier receiving a voltage controllable by said slope magnitude control signal and said noninverting input of said operational amplifier receiving a voltage controllable by said slope magnitude control signal and said switch.

* * * * *

UNITED STATES PATENT AND TRADEMARK OFFICE
CERTIFICATE OF CORRECTION

PATENT NO. : 4,811,019

DATED : March 7, 1989

INVENTOR(S) : Julstrom, Stephen D., et al

It is certified that error appears in the above-identified patent and that said Letters Patent is hereby corrected as shown below:

Column 1, line 53, "rat" should read -- rate --.
Column 2, line 9, after "signal" insert --.--.
Column 3, line 4, before "particularly" insert --(--.

Claim 1 should be cancelled.
Column 9, line 6, "2" should read --1--.
Column 9, line 40, insert the following claim:

--2. Adaptive coding circuitry according to claim 1 wherein said second conversion means includes capacitive means for controlling the attack and decay rate of said adaptive voltage.--.

Column 10, line 5, after "rate" insert --to said adaptation voltage, said decay rate--.

Signed and Sealed this

Third Day of November, 1992

Attest:

DOUGLAS B. COMER

*Attesting Officer*    Acting Commissioner of Patents and Trademarks